US010159343B2

(12) United States Patent
Chen et al.

(10) Patent No.: US 10,159,343 B2
(45) Date of Patent: Dec. 25, 2018

(54) SLIDE RAIL ASSEMBLY

(71) Applicants: KING SLIDE WORKS CO., LTD., Kaohsiung (TW); KING SLIDE TECHNOLOGY CO.,LTD., Kaohsiung (TW)

(72) Inventors: Ken-Ching Chen, Kaohsiung (TW); Shun-Ho Yang, Kaohsiung (TW); Zong-Sian Wong, Kaohsiung (TW); Chun-Chiang Wang, Kaohsiung (TW)

(73) Assignees: KING SLIDE WORKS CO., LTD., Kaohsiung (TW); KING SLIDE TECHNOLOGY CO., LTD., Kaohsiung (TW)

( * ) Notice: Subject to any disclaimer, the term of this patent is extended or adjusted under 35 U.S.C. 154(b) by 0 days.

(21) Appl. No.: 15/802,483

(22) Filed: Nov. 3, 2017

(65) Prior Publication Data

US 2018/0310710 A1 Nov. 1, 2018

(30) Foreign Application Priority Data

Apr. 28, 2017 (TW) ............................ 106114563 A

(51) Int. Cl.
*A47B 88/423* (2017.01)

(52) U.S. Cl.
CPC .... *A47B 88/423* (2017.01); *A47B 2088/4235* (2017.01); *A47B 2210/0035* (2013.01)

(58) Field of Classification Search
CPC ...................... A47B 88/423; A47B 2088/4235
See application file for complete search history.

(56) References Cited

U.S. PATENT DOCUMENTS

| | | | | |
|---|---|---|---|---|
| 6,230,903 B1 * | 5/2001 | Abbott | H05K 7/1421 | 211/190 |
| 6,854,816 B2 * | 2/2005 | Milligan | A47B 88/43 | 312/334.11 |
| 8,028,965 B2 * | 10/2011 | Chen | H05K 7/1489 | 248/298.1 |
| 9,089,215 B1 | 7/2015 | Wu | | |
| 9,328,769 B1 * | 5/2016 | Chen | H05K 7/1489 | |
| 9,504,181 B2 * | 11/2016 | Chen | H05K 7/1489 | |
| 9,723,746 B2 * | 8/2017 | Chen | H05K 7/1489 | |
| 9,848,702 B2 * | 12/2017 | Chen | A47B 96/067 | |
| 9,867,308 B2 * | 1/2018 | Chen | H05K 7/1489 | |
| 2001/0040142 A1 | 11/2001 | Haney | | |
| 2001/0040203 A1 * | 11/2001 | Brock | H02B 1/34 | 248/222.11 |
| 2014/0217049 A1 * | 8/2014 | Chen | H05K 7/1489 | 211/195 |

(Continued)

FOREIGN PATENT DOCUMENTS

EP 3 073 811 A1 9/2016

*Primary Examiner* — Daniel J Rohrhoff
(74) *Attorney, Agent, or Firm* — Winston Hsu

(57) ABSTRACT

A slide rail assembly includes a first rail, a second rail, a first bracket and a second bracket. The second rail is movable relative to the first rail. The first bracket is movably mounted to the first rail. The first bracket includes at least one first mounting member configured to be mounted to a first target object. The second bracket is movably mounted to one of the first bracket and the first rail. The second bracket includes at least one second mounting member configured to be mounted to a second target object.

37 Claims, 12 Drawing Sheets

(56) References Cited

U.S. PATENT DOCUMENTS

| | | | | |
|---|---|---|---|---|
| 2015/0069196 | A1* | 3/2015 | Chen | A47B 47/0058<br>248/218.4 |
| 2016/0278522 | A1 | 9/2016 | Chen | |
| 2016/0296016 | A1* | 10/2016 | Chen | H05K 7/1489 |
| 2017/0181543 | A1* | 6/2017 | Chen | A47B 96/068 |
| 2018/0125234 | A1* | 5/2018 | Chen | H05K 7/1489 |
| 2018/0140093 | A1* | 5/2018 | Chen | A47B 88/423 |

* cited by examiner

SLIDE RAIL ASSEMBLY

BACKGROUND OF THE INVENTION

1. Field of the Invention

The present invention relates to a slide rail assembly, and more particularly, to a slide rail assembly applicable to a rack.

2. Description of the Prior Art

As shown in FIG. 1, in a rack system, a slide rail assembly comprises a plurality of slide rails, such as a first rail 102, a second rail 104 and a third rail 106 movable relative to each other. Wherein, two parts of the first rail 102 (such as a front part and a rear part) can be fixedly mounted to a first post 114 and a second post 116 of a rack 112 respectively through a first bracket 108 and a second bracket 110. Moreover, since at least one of the first bracket 108 and the second bracket 110 is fixedly connected to the first rail 102, the first rail 102 is also fixedly mounted to the rack 112 when the first bracket 108 and the second bracket 110 are fixedly mounted to the rack 112. Therefore, only the second rail 104 and the third rail 106 can be moved along a direction D relative to the rack 112. Such design of the slide rail assembly cannot meet the market requirement to have a longer extension length.

SUMMARY OF THE INVENTION

An objective of the present invention is to provide a slide rail assembly having a longer extension length.

Another objective of the present invention is to provide a slide rail assembly having good supporting capability.

According to an embodiment of the present invention, a slide rail assembly is applicable to a rack. The slide rail assembly comprises a first rail, a first bracket, a second bracket and a second rail. The first bracket is configured to mount the first rail to a first post of the rack, wherein the first bracket and the first rail are movable relative to each other. The second bracket is configured to mount the first rail to a second post of the rack, wherein the second bracket and the first rail are movable relative to each other. The second rail is movable relative to the first rail. Wherein, the first rail is movable relative to the rack when the first bracket and the second bracket are mounted to the first post and the second post respectively.

Preferably, the slide rail assembly further comprises a third rail movably mounted between the first rail and the second rail.

Preferably, each of the first rail and the second rail comprises a front part and a rear part. When the second rail and the third rail are moved relative to the first rail along a first direction to be in an extended state, the first rail is movable relative to the rack along the first direction to allow the front part of the first rail to be located between the front part and the rear part of the second rail.

Preferably, the slide rail assembly further comprises at least one rolling member. The first bracket and the first rail are movable relative to each other through the at least one rolling member. The first bracket comprises a first supporting frame and at least one first mounting member connected to the first supporting frame. The first supporting frame comprises an upper supporting wall, a lower supporting wall and a middle wall connected between the upper supporting wall and the lower supporting wall of the first supporting frame. A first supporting passage is defined by the upper supporting wall, the lower supporting wall and the middle wall of the first supporting frame. The first supporting passage is configured to accommodate the at least one rolling member. The at least one rolling member is configured to abut against one of the upper supporting wall and the lower supporting wall of the first supporting frame. The at least one mounting member is configured to be mounted to the first post.

Preferably, the slide rail assembly further comprises an engaging member arranged on the first bracket. When the first rail is moved relative to the rack to a predetermined position along the first direction, the engaging member is engaged with the first rail to prevent the first rail from being moved relative to the bracket along a second direction.

Preferably, the first rail has an opening. The engaging member comprises a base part connected to the first bracket and an elastic part tilted relative to the base part. The elastic part of the engaging member is configured to engage with the opening when the first rail is located at the predetermined position.

Preferably, one of the third rail and the engaging member comprises a disengaging feature. The third rail is configured to disengage the elastic part of the engaging member from the opening of the first rail through the disengaging feature when the third rail is moved relative to the first rail along the second direction from the extended state.

Preferably, the second bracket comprises a second supporting frame and at least one second mounting member connected to the second supporting frame. The at least one second mounting member is configured to be mounted to the second post.

Preferably, the second supporting frame of the second bracket is movably mounted to the first supporting frame of the first bracket. The second supporting frame comprises an upper supporting wall, a lower supporting wall and a middle wall connected between the upper supporting wall and the lower supporting wall of the second supporting frame. A second supporting passage is defined by the upper supporting wall, the lower supporting wall and the middle wall of the second supporting frame. The second supporting passage is configured to accommodate the first supporting frame.

According to another embodiment of the present invention, a slide rail assembly comprises a first rail, a second rail, a third rail, a first bracket and a second bracket. The second rail is movable relative to the first rail. The third rail is movably mounted between the first rail and the second rail. The first bracket is movably mounted to the first rail, and configured to support the first rail. The second bracket movably mounted to one of the first rail and the first bracket, and configured to support the first rail.

According to another embodiment of the present invention, a slide rail assembly comprises a first rail, a second rail, a first bracket and a second bracket. The second rail is movable relative to the first rail. The first bracket is movably mounted to the first rail. The first bracket comprises at least one first mounting member. The least one first mounting member is configured to be mounted to a first target object. The second bracket is movably mounted to one of the first bracket and the first rail. The second bracket comprises at least one second mounting member. The at least one mounting member is configured to be mounted to a second target object.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
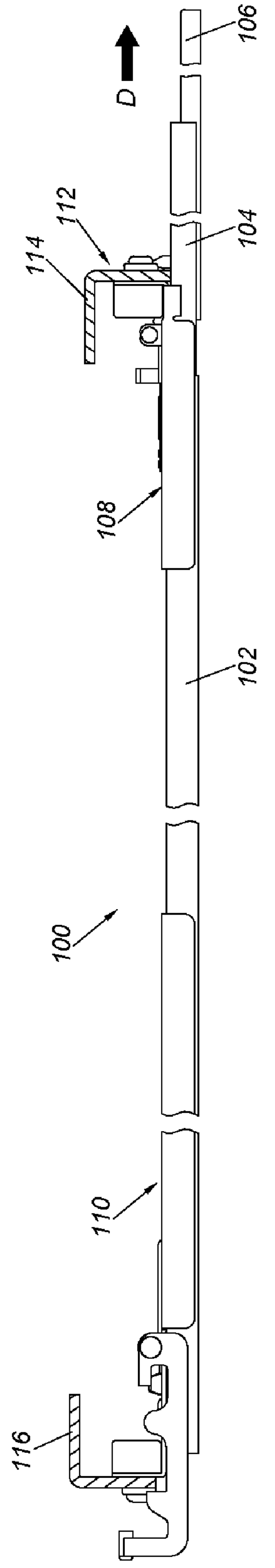
FIG. 1 is a diagram showing a slide rail assembly of the prior art mounted to a rack.
Figure 2:
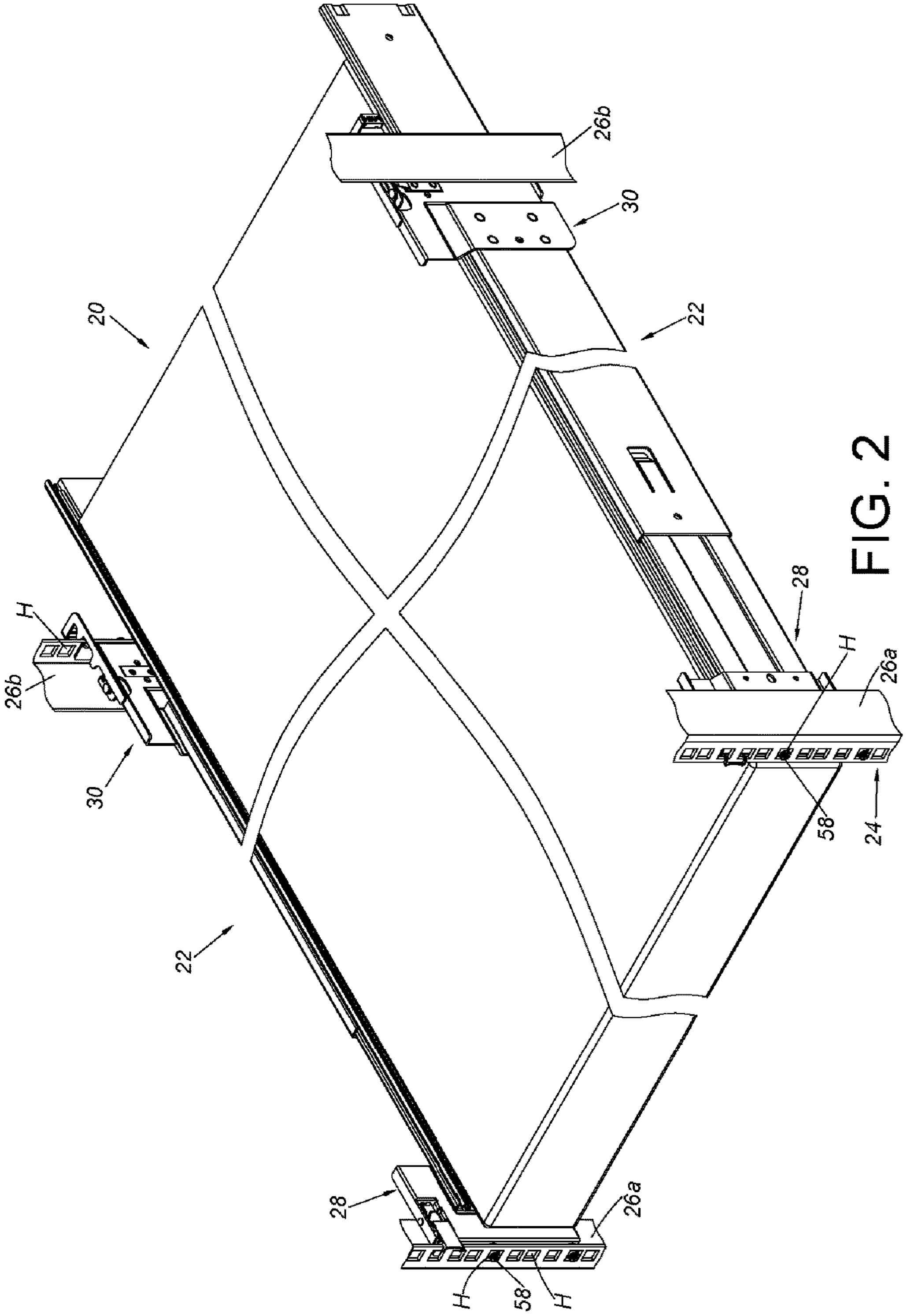
FIG. 2 is a diagram showing a carried object being mounted to a rack through a pair of slide rail assemblies according to an embodiment of the present invention.

As shown in FIG. 2, a carried object 20 is mounted to a rack 24 through a pair of slide rail assemblies 22 according to an embodiment of the present invention. Wherein, the carried object 20 can be an electronic apparatus, a chassis or a drawer, but the present invention is not limited thereto. The rack 24 comprises a pair of first posts 26*a* and a pair of second posts 26*b*. Each of the slide rail assembly 22 is configured to be mounted to the corresponding first post 26*a* and second post 26*b* through a first bracket 28 and a second bracket 30 respectively. For example, the first bracket 28 can be fixed to the rack 24 through a mounting hole H of the first post 26*a*, and the second bracket 30 can be fixed to the rack 24 through a mounting hole H of the second post 26*b*.

Figure 3:
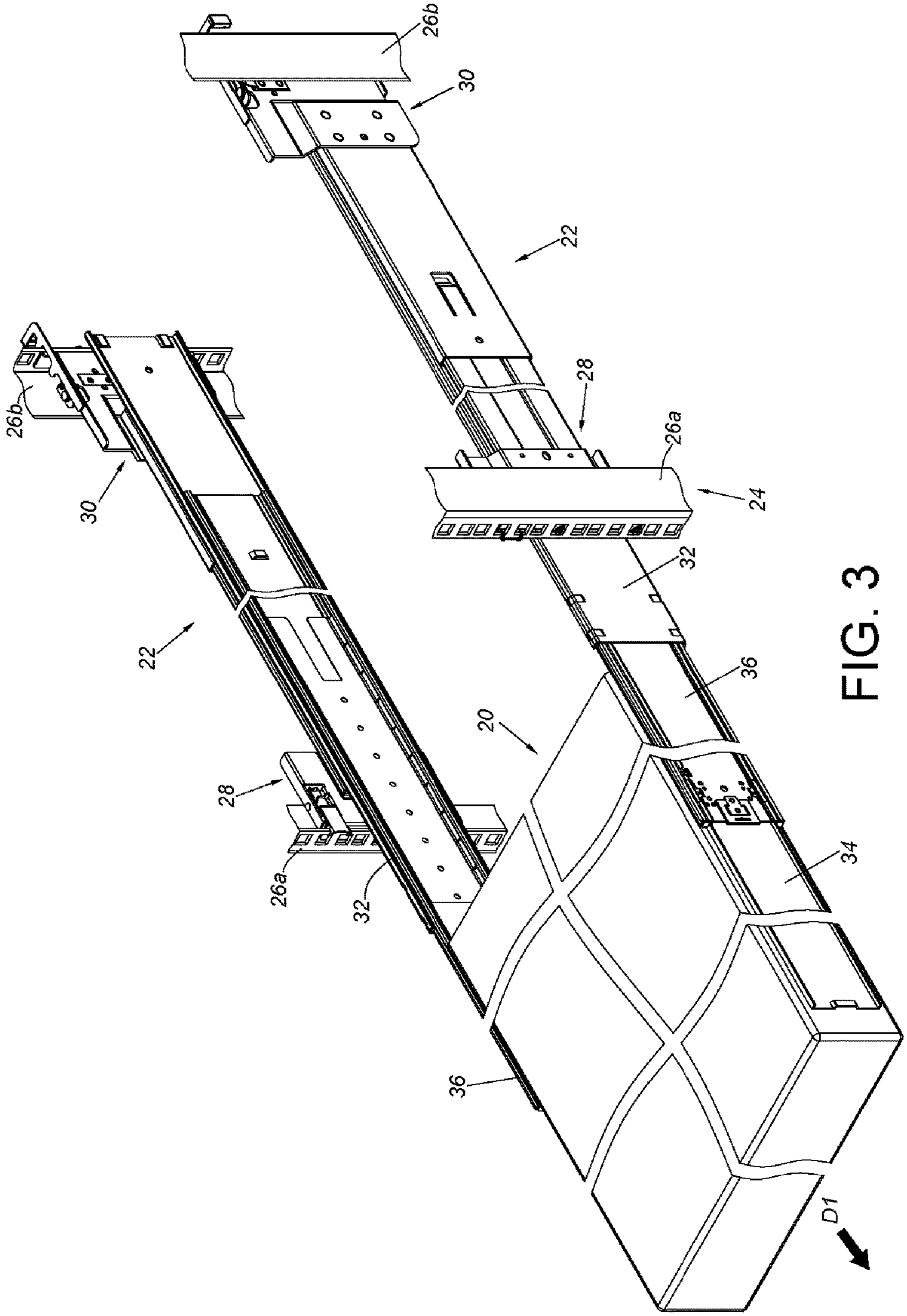
FIG. 3 is a diagram showing each of the slide rail assemblies being mounted to the rack, wherein all slide rails of the slide rail assembly are movable relative to the rack along a first direction according to an embodiment of the present invention.

AS shown in FIG. 3, the slide rail assembly 22 comprises a first rail 32 and a second rail 34. The second rail 34 is movable relative to the first rail 32 and configured to carry the carried object 20. Preferably, the slide rail assembly 22 further comprises a third rail 36 movably mounted between the first rail 32 and the second rail 34, and configured to extend a traveling distance of the second rail 34 relative to the first rail 32. Wherein, the first bracket 28 and the second bracket 30 are configured to mount the first rail 32 to the first post 26*a* and the second post 26*b* respectively. When the first bracket 28 and the second bracket 30 are respectively mounted to the first post 26*a* and the second post 26*b*, the first rail 32, the second rail 34 and the third rail 36 are movable relative to the first post 26*a* (or the first bracket 28) and the second post 26*b* (or the second bracket 30). In the present embodiment, the first rail 32, the second rail 34 and the third rail 36 are movable relative to the first post 26*a* and the second post 26*b* along a first direction D1 (such as an opening direction). Wherein, when the second rail 34 and the third rail 36 are moved relative to the first rail 32 along the first direction D1 to be in a fully extended state, the first rail 32 can be further moved relative to the first post 26*a* and the second post 26*b* along the first direction D1 in order to increase an extension length of the slide rail assembly 22, and provide better support to the second rail 34 and the third rail 36. In other words, when the first rail 32 is moved relative to the rack 24 along the first direction D1, the first rail 32 can improve supporting strength of the second rail 34 and the third rail 36 to the carried object 20. When the first bracket 28 and the second bracket 30 are respectively mounted to the first post 26*a* and the second post 26*b*, the first rail 32 can be moved relative to the first post 26*a* and the second post 26*b* along the first direction D1 in order to increase traveling distances of the second rail 34 and the third rail 36.

Figure 4:
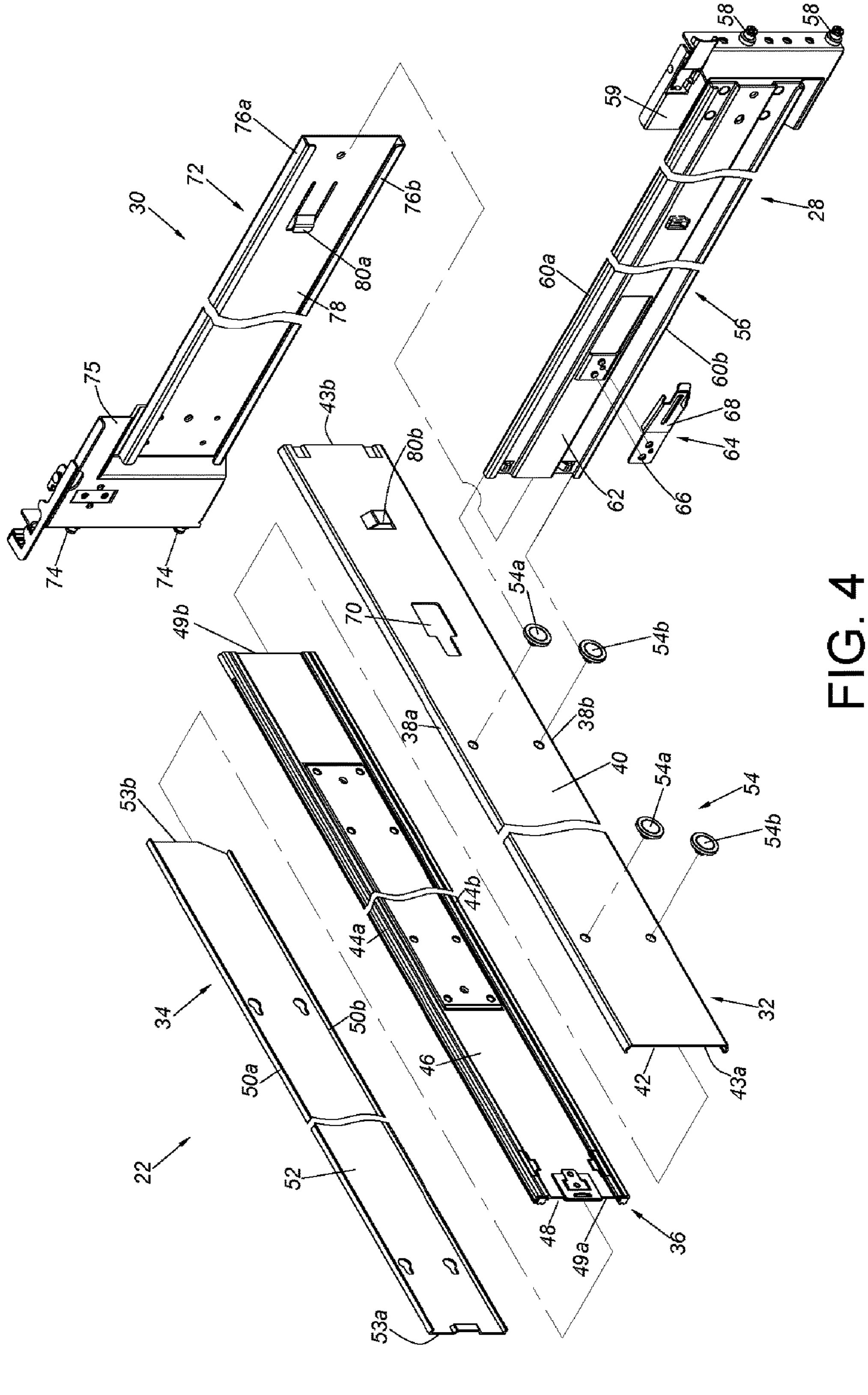
FIG. 4 is an exploded view of the slide rail assembly according to an embodiment of the present invention.
Figure 5:
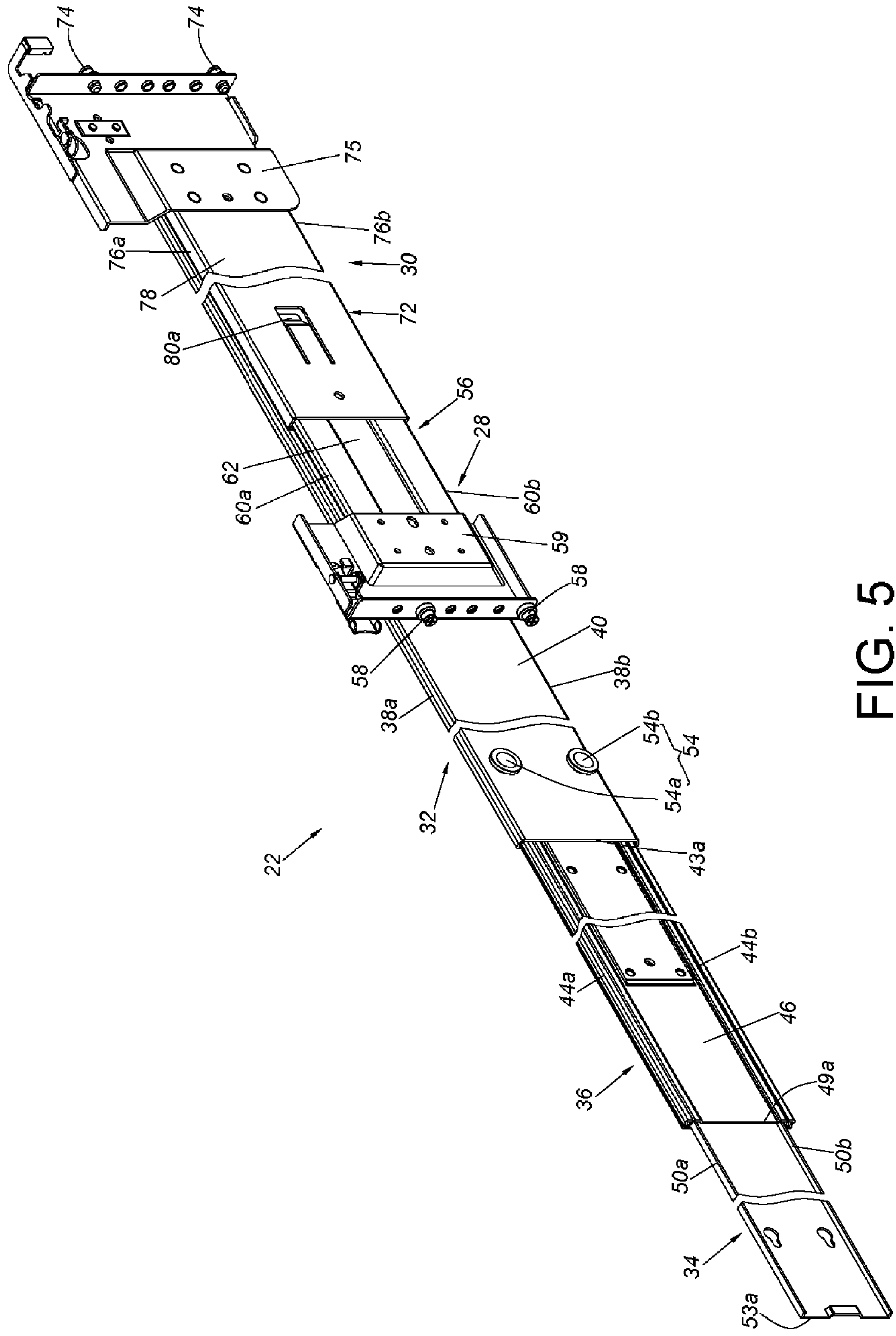
FIG. 5 is a diagram showing the slide rail assembly according to an embodiment of the present invention.

As shown in FIG. 4 and FIG. 5, the first rail 32 comprises a first wall 38*a*, a second wall 38*b* and a longitudinal wall 40 connected between the first wall 38*a* and the second wall 38*b* of the first rail 32. A first passage 42 is defined by the first wall 38*a*, the second wall 38*b* and the longitudinal wall 40 of the first rail 32. In addition, the first rail 32 has a front part 43*a* and a rear part 43*b*.

The third rail 36 is mounted into the first passage 42 to be movable relative to the first rail 32. Specifically, the third rail 36 comprises a first wall 44*a*, a second wall 44*b* and a longitudinal wall 46 connected between the first wall 44*a* and the second wall 44*b* of the third rail 36. A second passage 48 is defined by the first wall 44*a*, the second wall 44*b* and the longitudinal wall 46 of the third rail 36. In addition, the third rail 36 has a front part 49*a* and a rear part 49*b*.

The second rail 34 is mounted into the second passage 48 to be movable relative to the third rail 36. Specifically, the second rail 34 comprises a first wall 50*a*, a second wall 50*b* and a longitudinal wall 52 connected between the first wall 50*a* and the second wall 50*b* of the second rail 34. In addition, the second rail 34 has a front part 53*a* and a rear part 53*b*.

The first bracket 28 and the first rail 32 are movable relative to each other. In the present embodiment, the first bracket 28 is movably mounted to the first rail 32. Specifically, the first bracket 28 and the first rail 32 are movable relative to each other through a moving mechanism 54. Preferably, the moving mechanism 54 comprises a plurality of rolling members. In the present embodiment, the moving mechanism 54 comprises a first rolling member 54*a* and a second rolling member 54*b* arranged on the first rail 32. The first rolling member 54*a* is arranged at an outer side of the first rail 32 and adjacent to the first wall 38*a* of the first rail 32. The second rolling member 54*b* is arranged at the outer side of the first rail 32 and adjacent to the second wall 38*b* of the first rail 32. On the other hand, the first bracket 28 comprises a first supporting frame 56 and at least one first mounting member 58 connected to the first supporting frame 56. For example, the at least one first mounting member 58 is fixedly connected (such as by riveting or welding) to the first supporting frame 56 through a first component 59. The first supporting frame 56 comprises an upper supporting wall 60*a*, a lower supporting wall 60*b* and a middle wall 62 connected between the upper supporting wall 60*a* and the lower supporting wall 60*b* of the first supporting frame 56. The upper supporting wall 60*a* and the lower supporting wall 60*b* of the first supporting frame 56 are configured to abut against the first rolling member 54*a* and the second rolling member 54*b* respectively. Preferably, the slide rail assembly 22 further comprises an engaging member 64 arranged on the first bracket 28. The engaging member 64 comprises a base part 66 fixedly connected (such as by riveting or welding) to the first supporting frame 56 of the first bracket 28 and an elastic part 68 connected to the base part 66 and tilted relative to the base part 66. On the other hand, the longitudinal wall 40 of the first rail 32 has an opening 70 configured to cooperate with the elastic part 68 of the engaging member 64.

The second bracket 30 is movable relative to the first rail 32 and/or the first bracket 28. In the present embodiment, the second bracket 30 is movably mounted to the first bracket 28. Specifically, the second bracket 30 comprises a second supporting frame 72 and at least one second mounting member 74 connected to the second supporting frame 72. For example, the at least one second mounting member 74 is fixedly connected (such as by riveting or welding) to the second supporting frame 72 through a second component 75. The second supporting frame 72 is movably mounted to the first supporting frame 56 of the first bracket 28. The second supporting frame 72 comprises an upper supporting wall 76*a*, a lower supporting wall 76*b* and a middle wall 78 connected between the upper supporting wall 76*a* and the lower supporting wall 76*b* of the second supporting frame 72. In another embodiment, the second bracket 30 can be movably mounted to the first rail 32, but the present invention is not limited thereto. Preferably, the second bracket 30 comprises a first limiting feature 80*a* corresponding to a second limiting feature 80*b* of the first rail 32. In the present embodiment, the first limiting feature 80*a* and the second limiting feature 80*b* are convex structures.

Figure 6:
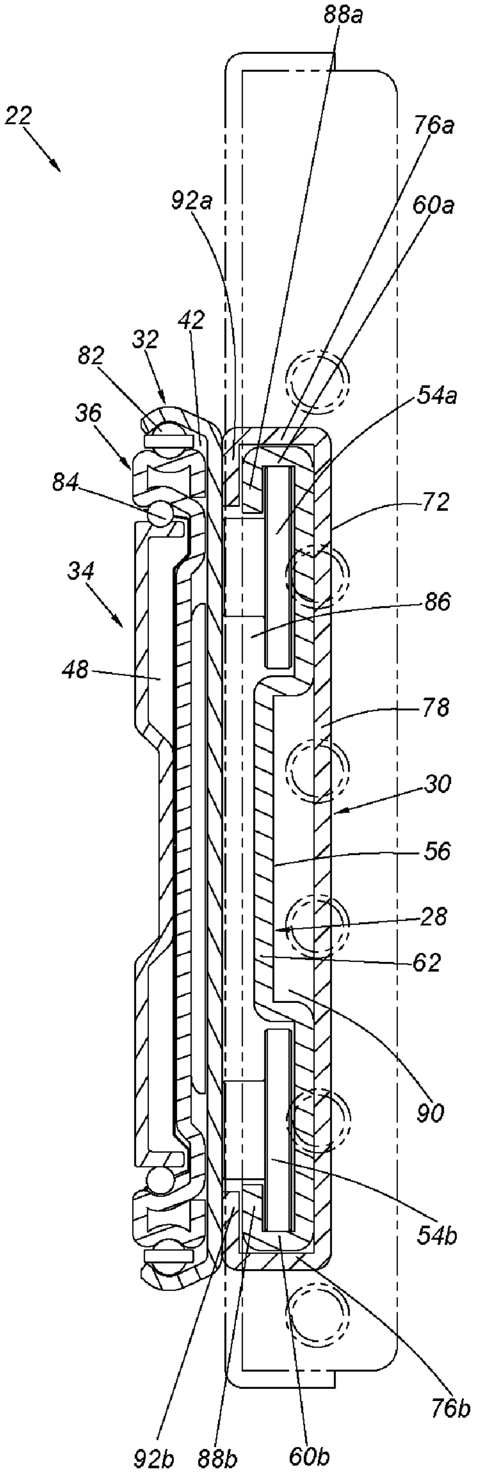
FIG. 6 is a cross-sectional view of the slide rail assembly according to an embodiment of the present invention.

As shown in FIG. 6, the third rail 36 of the slide rail assembly 22 is mounted into the first passage 42 of the first rail 32, and the second rail 34 is mounted into the second passage 48 of the third rail 36. Preferably, the slide rail assembly 22 further comprises a first ball retainer 82 arranged between the third rail 36 and the first rail 32, in order to improve smoothness of movement of the third rail 36 relative to the first rail 32. Preferably, the slide rail assembly 22 further comprises a second ball retainer 84 arranged between the second rail 34 and the third rail 36, in order to improve smoothness of relative movement between the second rail 34 and the third rail 36.

A first supporting passage 86 is defined by the upper supporting wall 60*a*, the lower supporting wall 60*b* and the middle wall 62 of the first supporting frame 56 of the first bracket 28. The first supporting passage 86 is configured to accommodate the first rolling member 54*a* and the second rolling member 54*b*. The first rolling member 54*a* and the second rolling member 54*b* are configured to respectively abut against the upper supporting wall 60*a* and the lower supporting wall 60*b* of the first supporting frame 56 of the first bracket 28, in order to support the first rail 32 and improve smoothness of movement of the first rail 32 relative to the first bracket 28. Preferably, the first bracket 28 further comprises a first extension wall 88*a* and a second extension wall 88*b* respectively bent relative to the upper supporting wall 60*a* and the lower supporting wall 60*b* of the first bracket 28, in order to support the first rolling member 54*a* and the second rolling member 54*b* respectively. On the other hand, a second supporting passage 90 is defined by the upper supporting wall 76*a*, the lower supporting wall 76*b* and the middle wall 78 of the second supporting frame 72 of the second bracket 30. The second supporting passage 90 is configured to accommodate and support the first supporting frame 56 of the first bracket 28, such that the second bracket 30 is movable relative to and the first bracket 28 and/or the first rail 32. Preferably, the second bracket 30 further comprises a first extension wall 92*a* and a second extension wall 92*b* respectively bent relative to the upper supporting wall 76*a* and the lower supporting wall 76*b* of the second bracket 30, in order to support the first extension wall 88*a* and the second extension wall 88*b* of the first bracket 28 respectively.

Figure 7:
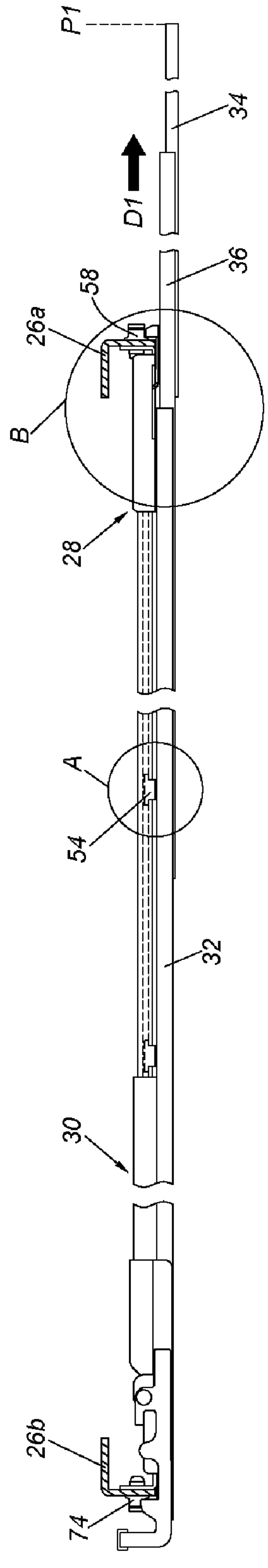
FIG. 7 is a diagram showing a first rail of the slide rail assembly being mounted to the rack through two brackets, and a second rail and a third rail of the slide rail assembly being moved relative to the rack along the first direction according to an embodiment of the present invention.
Figure 8:
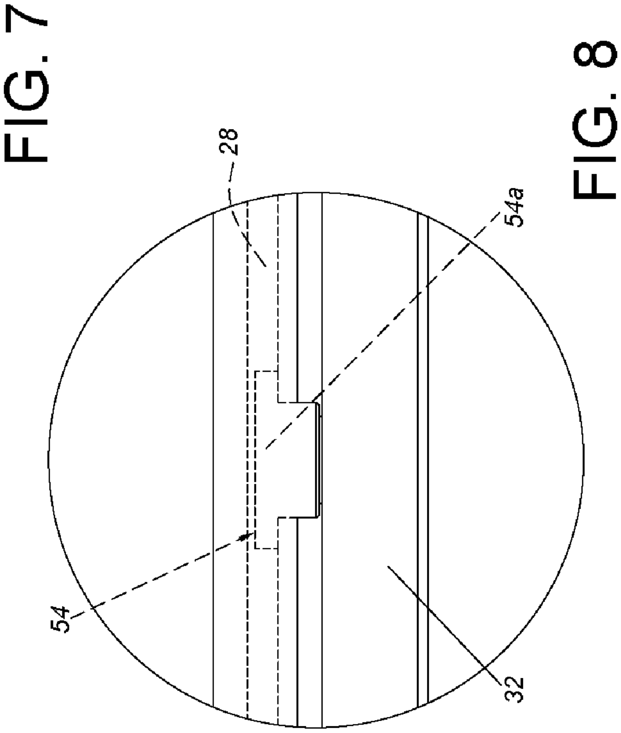
FIG. 8 is an enlarged view of an area A of FIG. 7.

As shown in FIG. 7 and FIG. 8, the first bracket 28 and the second bracket 30 are mounted to the first post 26*a* (or called as first target object) and the second post 26*b* (or called as second target object) of the rack 24 respectively through the at least one first mounting member 58 and the at least one second mounting member 74. On the other hand, the moving mechanism 54 (such as the first rolling member 54*a*) is configured to assist the first rail 32 in moving relative to the first bracket 28. Wherein, when the first bracket 28 and the second bracket 30 are respectively mounted to the first post 26*a* and the second post 26*b*, the second rail 34 and the third rail 36 are movable relative to the rack (or relative to the first post 26*a* and the second post 26*b*) and the first rail 32 along the first direction D1.

Figure 9:
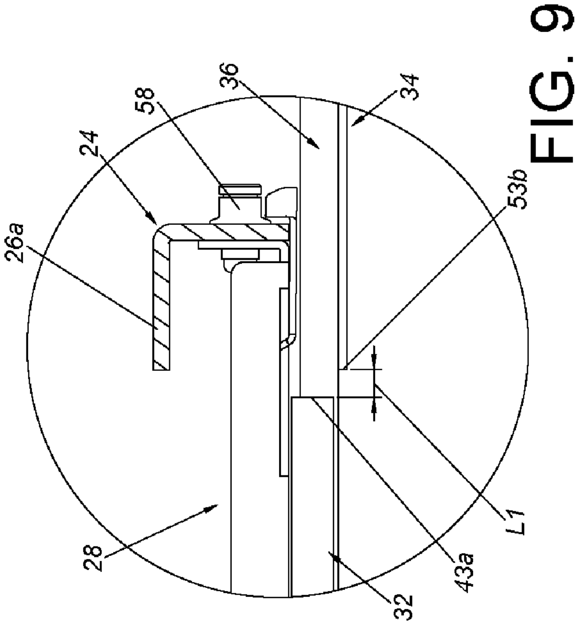
FIG. 9 is an enlarged view of an area B of FIG. 7.

As shown in FIG. 7 and FIG. 9, when the second rail 34 is moved relative the first rail 32 to the first position P1, the rear part 53*b* of the second rail 34 exceeds the front part 43*a* of the first rail 32 a first distance L1.

Figure 10:
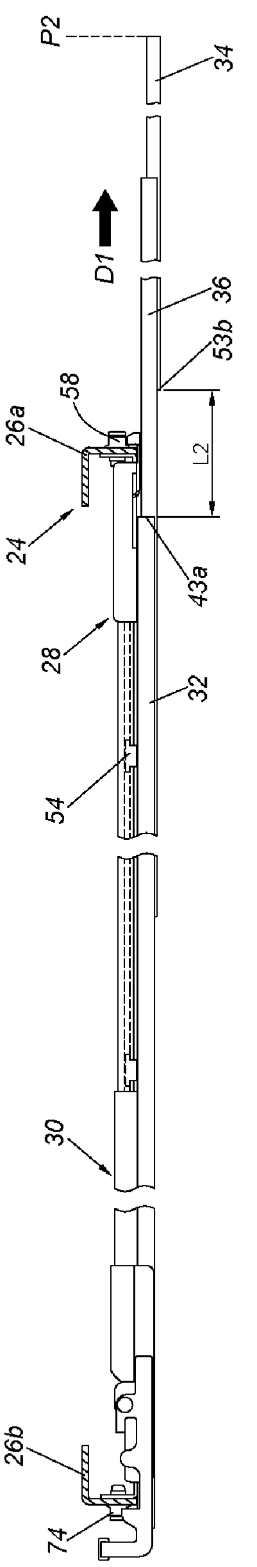
FIG. 10 is a diagram showing the second rail and the third rail of the slide rail assembly being further moved relative to the rack along the first direction to be in an extended state according to an embodiment of the present invention.

As shown in FIG. 10, when the second rail 34 is further moved relative to the rack 24 (or relative to the first post 26*a* and the second post 26*b*) along the first direction D1 to a second position P2, the rear part 53*b* of the second rail 34 exceeds the front part 43*a* of the first rail 32 a second distance L2 greater than the first distance L1. Wherein, when the second rail 34 is located at the second position P2, the second rail 34 and the third rail 36 are in the fully extended state relative to the first rail 32.

Figure 11:
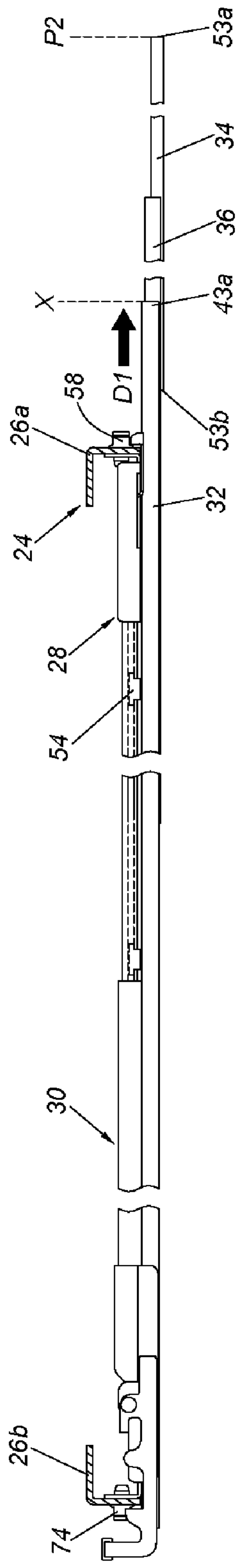
FIG. 11 is a diagram showing the second rail and the third rail of the slide rail assembly in the extended state and the first rail being further moved relative to the rack along the first direction according to an embodiment of the present invention.

As shown in FIG. 11, when the second rail 34 and the third rail 36 are in the fully extended state, the first rail 32 can be further moved relative to the first bracket 28 or the rack 24 along the first direction D1 through the moving mechanism 54 until the first rail 32 reaches a predetermined position X. When the first rail 32 reaches the predetermined position X, the front part 43*a* of the first rail 32 is located between the front part 53*a* and the rear part 53*b* of the second rail 34. Therefore, the rear part 53*b* of the second rail 34 no longer exceeds the front part 43*a* of the first rail 32 a distance (such as the first distance L1 or the second distance L2), so as to improve supporting strength of the first rail 32 to the second rail 34 (and the third rail 36). In other words, when the first rail 32 is further moved along the first direction D1, an amount (or a range) of the first rail 32 holding the second rail 34 (and the third rail 36) can be increased.

Figure 12:
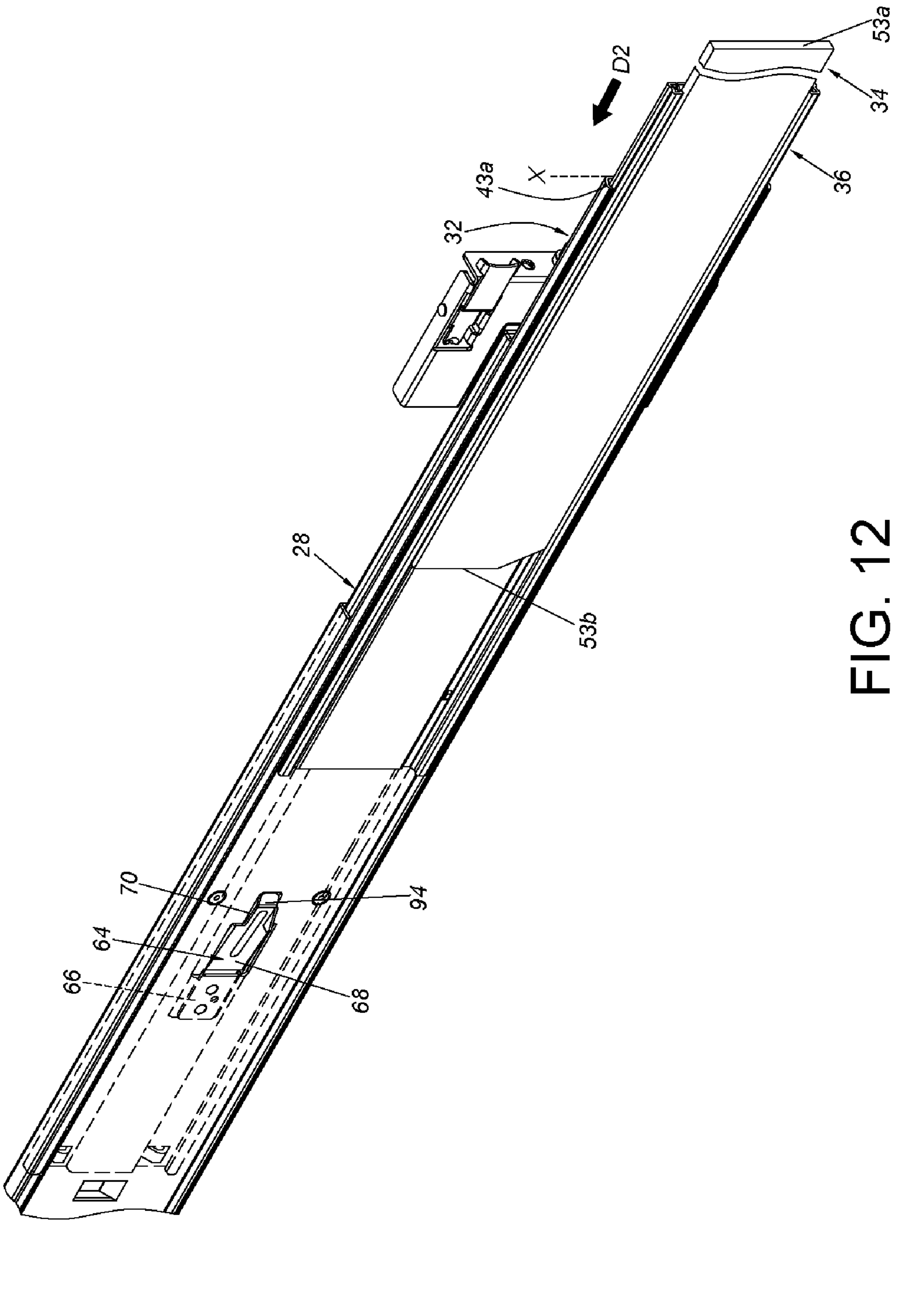
FIG. 12 is a diagram showing the second rail and the third rail being moved relative to the rack from the extended state along a second direction according to an embodiment of the present invention.

As shown in FIG. 12, when the second rail 34 and the third rail 36 are in the fully extended state relative to the first rail 32, and the first rail 32 is further moved relative to the first bracket 28 to the predetermined position X, the elastic part 68 of the engaging member 64 is configured to engage with the opening 70 of the first rail 32, in order to prevent the first rail 32 from being moved along a second direction D2 (such as a retracted direction). As such, the front part 43*a* of the first rail 32 can be temporarily held between the front part 53*a* and the rear part 53*b* of the second rail 34. Preferably, one of the third rail 36 and the engaging member 64 comprises a disengaging feature 94. In the present embodiment, the elastic part 68 of the engaging member 64 has the disengaging feature 94, and the disengaging feature 94 has an inclined surface or an arc surface.

Figure 13:
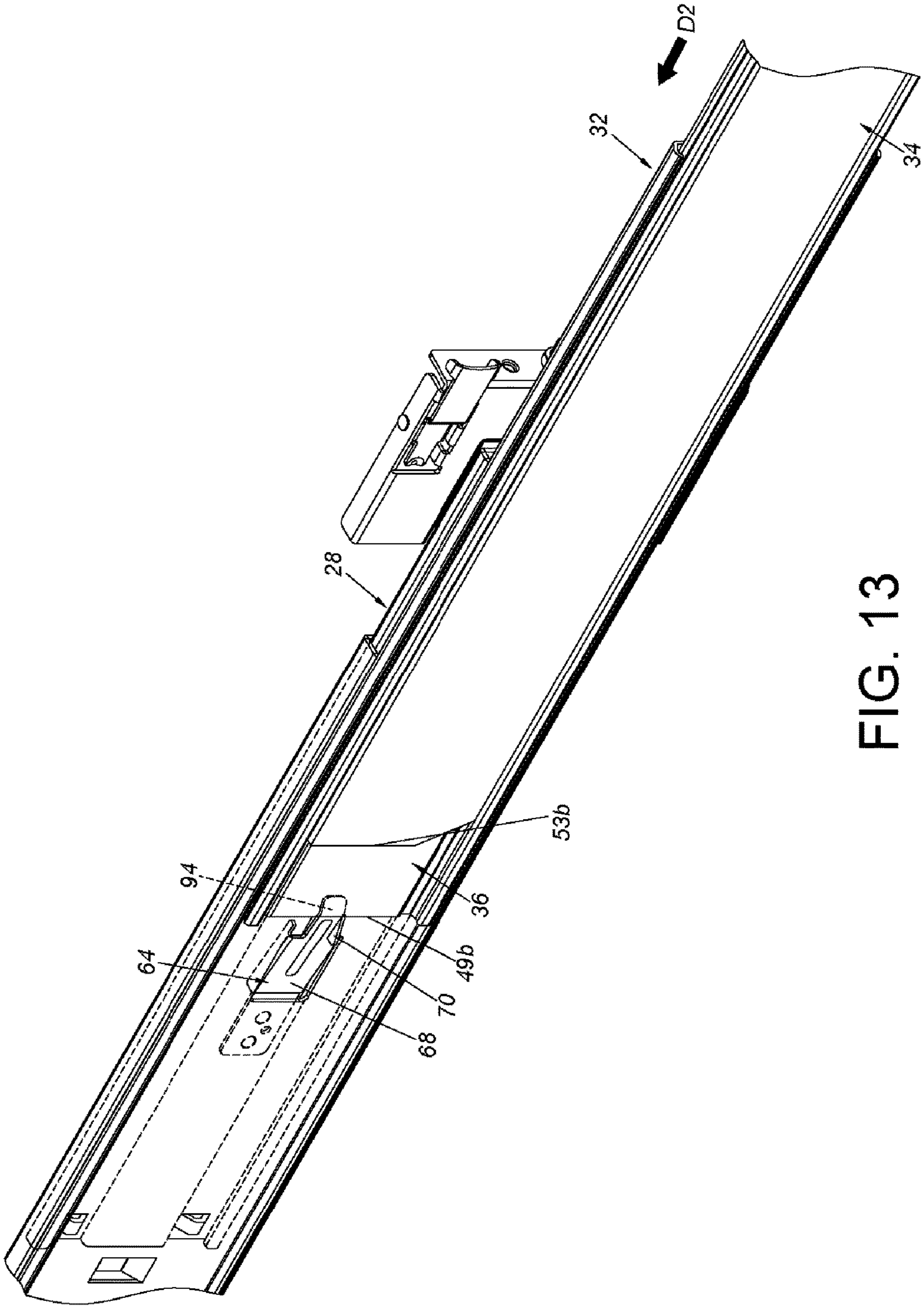
FIG. 13 is a diagram showing the second rail and the third rail being further moved relative to the rack along the second direction according to an embodiment of the present invention.
Figure 14:
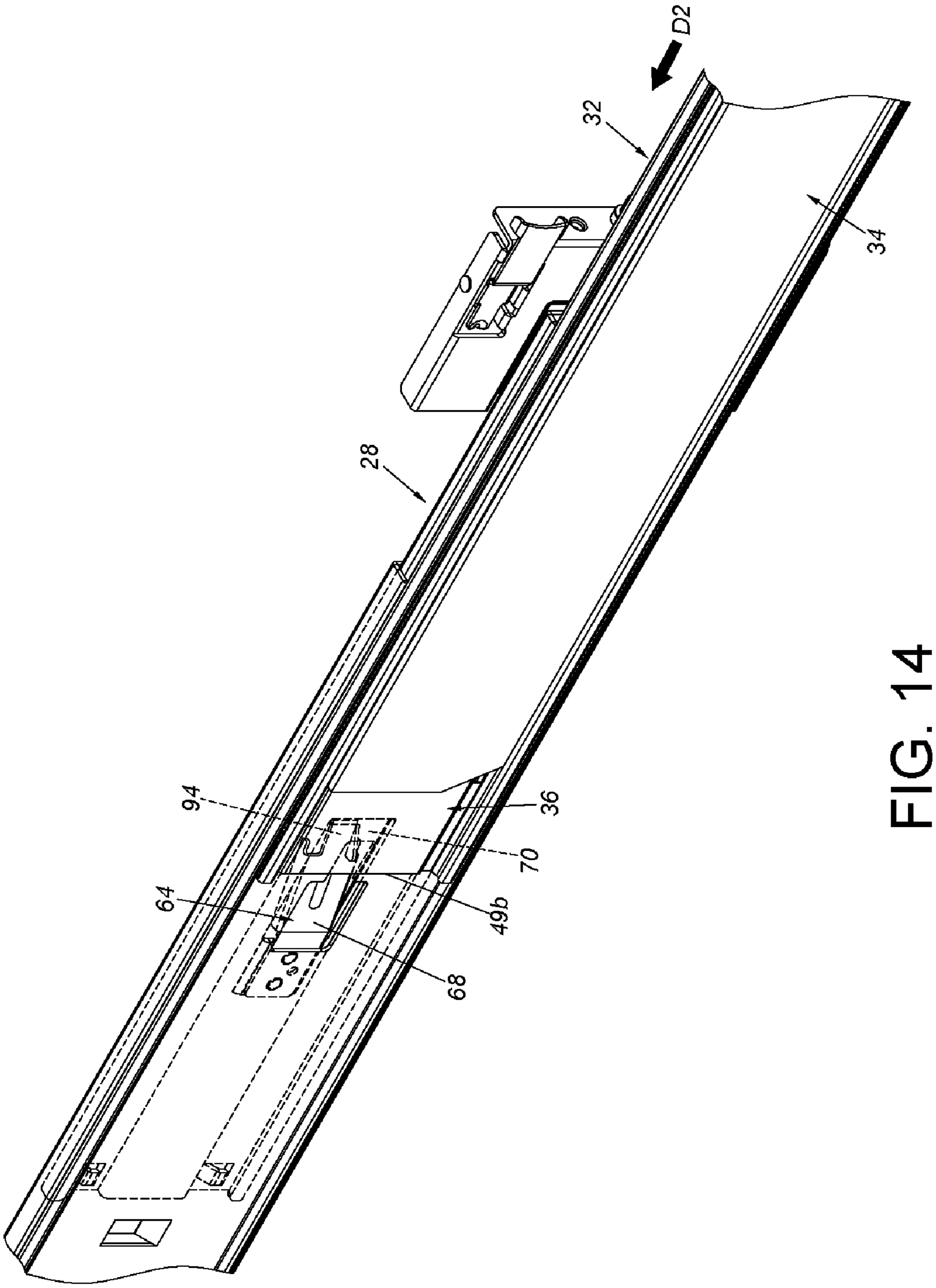
FIG. 14 is a diagram showing the second rail and the third rail being further moved relative to the rack along the second direction according to an embodiment of the present invention.
Figure 15:
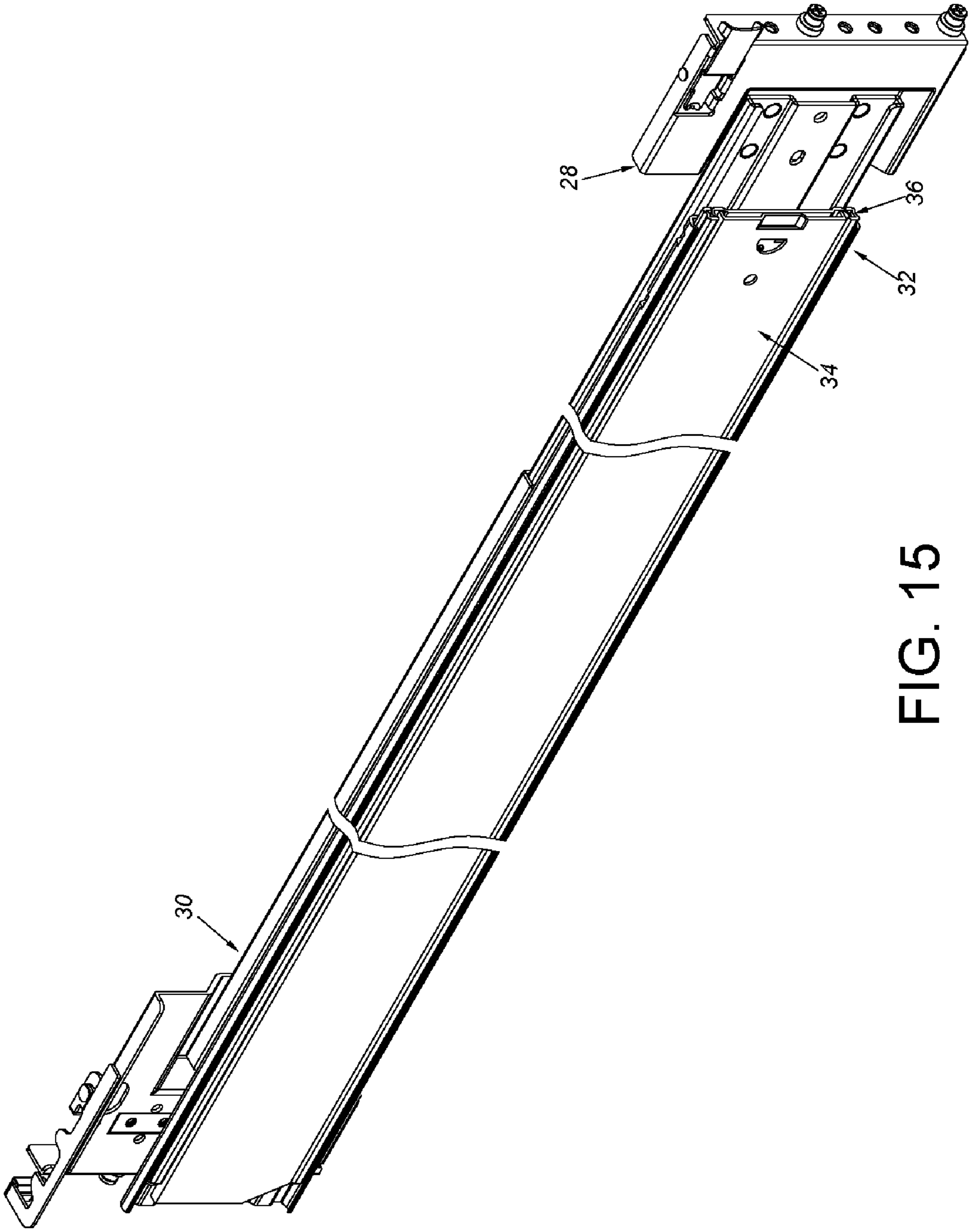
FIG. 15 is a diagram showing all slide rails of the slide rail assembly being retracted according to an embodiment of the present invention.

As shown in FIG. 13, FIG. 14 and FIG. 15, when the third rail 36 is moved from the extended state relative to the first rail 32 along the second direction D2, a portion of the third rail 36 (such as the rear part 49*b*) is configured to drive the elastic part 68 of the engaging member 64 to deflect relative to the base part 66 through the disengaging feature 94, in order to disengage the elastic part 68 of the engaging member 64 from the opening 70 of the first rail 32. As such, the first rail 32 is movable relative to the first bracket 28 along the second direction D2 until the first rail 32, the second rail 34 and the third rail 36 are retracted.

Therefore, the slide rail assembly 22 of the present invention is characterized in that:

1. The first bracket 28 and the first rail 32 are movable relative to each other, and the second bracket 30 is also movable relative to the first rail 32 (or the first brackets 28).

2. When the first rail 32 is mounted to the rack 24 (or target objects) through the first bracket 28 and the second bracket 30, the first rail 32 is movable relative to the rack 24 along the first direction D1, in order to improve the supporting strength of the first rail 32 to the other slide rails (such as the second rail 34 or the third rail 36). In addition, since the first rail 32 is movable relative to the rack 24 along the first direction D1, the traveling distances of the second rail 34 and the third rail 36 can be increased.

3. The first bracket 28 and the first rail 32 are movable relative to each other through the first rolling member 54*a* and the second rolling member 54*b*, in order to assist the first rail 32 and the first bracket 28 in moving relative to each other.

4. When the second rail 34 and the third rail 36 are in the extended state relative to the first rail 32, and the first rail 32 is further moved to the predetermined position X, the engaging member 64 is configured to engage with the first rail 32, in order to prevent the first rail 32 from being moved relative to the first bracket 28 along the second direction D2.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A slide rail assembly applicable to a rack, the slide rail assembly comprising:

a first rail;

a first bracket configured to mount the first rail to a first post of the rack, wherein the first bracket and the first rail are movable relative to each other;

a second bracket configured to mount the first rail to a second post of the rack, wherein the second bracket and the first rail are movable relative to each other; and a second rail movable relative to the first rail;

wherein the first rail is movable relative to the rack when the first bracket and the second bracket are mounted to the first post and the second post respectively;

wherein the slide rail assembly further comprises a third rail movably mounted between the first rail and the second rail, each of the first rail and the second rail comprises a front part and a rear part, when the second rail and the third rail are moved relative to the first rail along a first direction to be in an extended state, the first rail is movable relative to the rack along the first direction to allow the front part of the first rail to be located between the front part and the rear part of the second rail.

2. The slide rail assembly of claim 1, further comprising at least one rolling member, wherein the first bracket and the first rail are movable relative to each other through the at least one rolling member, the first bracket comprises a first supporting frame and at least one first mounting member connected to the first supporting frame, the first supporting frame comprises an upper supporting wall, a lower supporting wall and a middle wall connected between the upper supporting wall and the lower supporting wall of the first supporting frame, a first supporting passage is defined by the upper supporting wall, the lower supporting wall and the middle wall of the first supporting frame, the first supporting passage is configured to accommodate the at least one rolling member, the at least one rolling member is configured to abut against one of the upper supporting wall and the lower supporting wall of the first supporting frame, the at least one mounting member is configured to be mounted to the first post.

3. The slide rail assembly of claim 2, wherein the second bracket comprises a second supporting frame and at least one second mounting member connected to the second supporting frame, the at least one second mounting member is configured to be mounted to the second post.

4. The slide rail assembly of claim 3, wherein the second supporting frame of the second bracket is movably mounted to the first supporting frame of the first bracket, the second supporting frame comprises an upper supporting wall, a lower supporting wall and a middle wall connected between the upper supporting wall and the lower supporting wall of the second supporting frame, a second supporting passage is defined by the upper supporting wall, the lower supporting wall and the middle wall of the second supporting frame, the second supporting passage is configured to accommodate the first supporting frame.

5. The slide rail assembly of claim 1, further comprising an engaging member arranged on the first bracket, wherein when the first rail is moved relative to the rack to a predetermined position along the first direction, the engaging member is engaged with the first rail to prevent the first rail from being moved relative to the bracket along a second direction.

6. The slide rail assembly of claim 5, further comprising at least one rolling member, wherein the first bracket and the first rail are movable relative to each other through the at least one rolling member, the first bracket comprises a first supporting frame and at least one first mounting member connected to the first supporting frame, the first supporting frame comprises an upper supporting wall, a lower supporting wall and a middle wall connected between the upper supporting wall and the lower supporting wall of the first supporting frame, a first supporting passage is defined by the upper supporting wall, the lower supporting wall and the middle wall of the first supporting frame, the first supporting passage is configured to accommodate the at least one rolling member, the at least one rolling member is configured to abut against one of the upper supporting wall and the lower supporting wall of the first supporting frame, the at least one mounting member is configured to be mounted to the first post.

7. The slide rail assembly of claim 6, wherein the second bracket comprises a second supporting frame and at least one second mounting member connected to the second supporting frame, the at least one second mounting member is configured to be mounted to the second post.

8. The slide rail assembly of claim 7, wherein the second supporting frame of the second bracket is movably mounted to the first supporting frame of the first bracket, the second supporting frame comprises an upper supporting wall, a lower supporting wall and a middle wall connected between the upper supporting wall and the lower supporting wall of the second supporting frame, a second supporting passage is defined by the upper supporting wall, the lower supporting wall and the middle wall of the second supporting frame, the second supporting passage is configured to accommodate the first supporting frame.

9. The slide rail assembly of claim 5, wherein the first rail has an opening, and the engaging member comprises a base part connected to the first bracket and an elastic part tilted relative to the base part, the elastic part of the engaging member is configured to engage with the opening when the first rail is located at the predetermined position.

10. The slide rail assembly of claim 9, further comprising at least one rolling member, wherein the first bracket and the first rail are movable relative to each other through the at least one rolling member, the first bracket comprises a first supporting frame and at least one first mounting member connected to the first supporting frame, the first supporting frame comprises an upper supporting wall, a lower supporting wall and a middle wall connected between the upper supporting wall and the lower supporting wall of the first supporting frame, a first supporting passage is defined by the upper supporting wall, the lower supporting wall and the middle wall of the first supporting frame, the first supporting passage is configured to accommodate the at least one rolling member, the at least one rolling member is configured to abut against one of the upper supporting wall and the lower supporting wall of the first supporting frame, the at least one mounting member is configured to be mounted to the first post.

11. The slide rail assembly of claim 10, wherein the second bracket comprises a second supporting frame and at least one second mounting member connected to the second supporting frame, the at least one second mounting member is configured to be mounted to the second post.

12. The slide rail assembly of claim 11, wherein the second supporting frame of the second bracket is movably mounted to the first supporting frame of the first bracket, the second supporting frame comprises an upper supporting wall, a lower supporting wall and a middle wall connected between the upper supporting wall and the lower supporting wall of the second supporting frame, a second supporting passage is defined by the upper supporting wall, the lower supporting wall and the middle wall of the second supporting frame, the second supporting passage is configured to accommodate the first supporting frame.

13. The slide rail assembly of claim 9, wherein one of the third rail and the engaging member comprises a disengaging feature, the third rail is configured to disengage the elastic part of the engaging member from the opening of the first rail through the disengaging feature when the third rail is moved relative to the first rail along the second direction from the extended state.

14. The slide rail assembly of claim 13, further comprising at least one rolling member, wherein the first bracket and the first rail are movable relative to each other through the at least one rolling member, the first bracket comprises a first supporting frame and at least one first mounting member connected to the first supporting frame, the first supporting frame comprises an upper supporting wall, a lower supporting wall and a middle wall connected between the upper supporting wall and the lower supporting wall of the first supporting frame, a first supporting passage is defined by the upper supporting wall, the lower supporting wall and the middle wall of the first supporting frame, the first supporting passage is configured to accommodate the at least one rolling member, the at least one rolling member is configured to abut against one of the upper supporting wall and the lower supporting wall of the first supporting frame, the at least one mounting member is configured to be mounted to the first post.

15. The slide rail assembly of claim 14, wherein the second bracket comprises a second supporting frame and at least one second mounting member connected to the second supporting frame, the at least one second mounting member is configured to be mounted to the second post.

16. The slide rail assembly of claim 15, wherein the second supporting frame of the second bracket is movably mounted to the first supporting frame of the first bracket, the second supporting frame comprises an upper supporting wall, a lower supporting wall and a middle wall connected between the upper supporting wall and the lower supporting wall of the second supporting frame, a second supporting passage is defined by the upper supporting wall, the lower supporting wall and the middle wall of the second supporting frame, the second supporting passage is configured to accommodate the first supporting frame.

17. A slide rail assembly, comprising:

a first rail;

a second rail movable relative to the first rail;

a third rail movably mounted between the first rail and the second rail;

a first bracket movably mounted to the first rail, and configured to support the first rail; and a second bracket movably mounted to one of the first rail and the first bracket, and configured to support the first rail;

wherein the first bracket and the first rail are movable relative to each other through a moving mechanism, the moving mechanism comprises at least one rolling member, the first bracket comprises a first supporting frame and at least one first mounting member connected to the first supporting frame, the first supporting frame comprises an upper supporting wall, a lower supporting wall and a middle wall connected between the upper supporting wall and the lower supporting wall of the first supporting frame, a first supporting passage is defined by the upper supporting wall, the lower supporting wall and the middle wall of the first supporting frame, the first supporting passage is configured to accommodate the at least one rolling member, the at least one rolling member is configured to abut against one of the upper supporting wall and the lower supporting wall of the first supporting frame.

18. The slide rail assembly of claim 17, further comprising an engaging member arranged on the first bracket, wherein when the first rail is moved relative to the first bracket to a predetermined position along the first direction, the engaging member is engaged with the first rail to prevent the first rail from being moved relative to the bracket along a second direction.

19. The slide rail assembly of claim 18, wherein the first rail has an opening, and the engaging member comprises a base part connected to the first bracket and an elastic part tilted relative to the base part, the elastic part of the engaging member is configured to engage with the opening when the first rail is located at the predetermined position.

20. The slide rail assembly of claim 19, wherein one of the third rail and the engaging member comprises a disengaging feature, the third rail is configured to disengage the elastic part of the engaging member from the opening of the first rail through the disengaging feature when the third rail is moved relative to the first rail along the second from an extended state.

21. The slide rail assembly of claim 17, wherein the second bracket comprises a second supporting frame and at least one second mounting member connected to the second supporting frame.

22. The slide rail assembly of claim 21, further comprising an engaging member arranged on the first bracket, wherein when the first rail is moved relative to the first bracket to a predetermined position along the first direction, the engaging member is engaged with the first rail to prevent the first rail from being moved relative to the bracket along a second direction.

23. The slide rail assembly of claim 22, wherein the first rail has an opening, and the engaging member comprises a base part connected to the first bracket and an elastic part tilted relative to the base part, the elastic part of the engaging member is configured to engage with the opening when the first rail is located at the predetermined position.

24. The slide rail assembly of claim 23, wherein one of the third rail and the engaging member comprises a disengaging feature, the third rail is configured to disengage the elastic part of the engaging member from the opening of the first rail through the disengaging feature when the third rail is moved relative to the first rail along the second from an extended state.

25. The slide rail assembly of claim 21, wherein the second supporting frame of the second bracket is movably mounted to the first supporting frame of the first bracket, the second supporting frame comprises an upper supporting wall, a lower supporting wall and a middle wall connected between the upper supporting wall and the lower supporting wall of the second supporting frame, a second supporting passage is defined by the upper supporting wall, the lower supporting wall and the middle wall of the second supporting frame, the second supporting passage is configured to accommodate the first supporting frame.

26. The slide rail assembly of claim 25, further comprising an engaging member arranged on the first bracket, wherein when the first rail is moved relative to the first bracket to a predetermined position along the first direction, the engaging member is engaged with the first rail to prevent the first rail from being moved relative to the bracket along a second direction.

27. The slide rail assembly of claim 26, wherein the first rail has an opening, and the engaging member comprises a base part connected to the first bracket and an elastic part tilted relative to the base part, the elastic part of the engaging member is configured to engage with the opening when the first rail is located at the predetermined position.

28. The slide rail assembly of claim 27, wherein one of the third rail and the engaging member comprises a disengaging feature, the third rail is configured to disengage the elastic part of the engaging member from the opening of the first rail through the disengaging feature when the third rail is moved relative to the first rail along the second from an extended state.

29. A slide rail assembly applicable to a rack, the slide rail assembly comprising:

a first rail;

a first bracket configured to mount the first rail to a first post of the rack, wherein the first bracket and the first rail are movable relative to each other;

a second bracket configured to mount the first rail to a second post of the rack, wherein the second bracket and the first rail are movable relative to each other; and a second rail movable relative to the first rail;

wherein the first rail is movable relative to the rack when the first bracket and the second bracket are mounted to the first post and the second post respectively;

wherein the slide rail assembly further comprises a third rail movably mounted between the first rail and the second rail;

wherein the slide rail assembly further comprises at least one rolling member, wherein the first bracket and the first rail are movable relative to each other through the at least one rolling member, the first bracket comprises a first supporting frame and at least one first mounting member connected to the first supporting frame, the first supporting frame comprises an upper supporting wall, a lower supporting wall and a middle wall connected between the upper supporting wall and the lower supporting wall of the first supporting frame, a first supporting passage is defined by the upper supporting wall, the lower supporting wall and the middle wall of the first supporting frame, the first supporting passage is configured to accommodate the at least one rolling member, the at least one rolling member is configured to abut against one of the upper supporting wall and the lower supporting wall of the first supporting frame, the at least one mounting member is configured to be mounted to the first post.

30. The slide rail assembly of claim 29, wherein the second bracket comprises a second supporting frame and at least one second mounting member connected to the second supporting frame, the at least one second mounting member is configured to be mounted to the second post.

31. The slide rail assembly of claim 30, wherein the second supporting frame of the second bracket is movably mounted to the first supporting frame of the first bracket, the second supporting frame comprises an upper supporting wall, a lower supporting wall and a middle wall connected between the upper supporting wall and the lower supporting wall of the second supporting frame, a second supporting passage is defined by the upper supporting wall, the lower supporting wall and the middle wall of the second supporting frame, the second supporting passage is configured to accommodate the first supporting frame.

32. A slide rail assembly, comprising:

a first rail;

a second rail movable relative to the first rail;

a third rail movably mounted between the first rail and the second rail;

a first bracket movably mounted to the first rail, and configured to support the first rail; and a second bracket movably mounted to one of the first rail and the first bracket, and configured to support the first rail;

wherein the slide rail assembly further comprises an engaging member arranged on the first bracket, wherein when the first rail is moved relative to the first bracket to a predetermined position along the first direction, the engaging member is engaged with the first rail to prevent the first rail from being moved relative to the bracket along a second direction;

wherein the first rail has an opening, and the engaging member comprises a base part connected to the first bracket and an elastic part tilted relative to the base part, the elastic part of the engaging member is configured to engage with the opening when the first rail is located at the predetermined position.

33. The slide rail assembly of claim 32, wherein the first bracket and the first rail are movable relative to each other through a moving mechanism.

34. The slide rail assembly of claim 33, wherein the moving mechanism comprises at least one rolling member.

35. The slide rail assembly of claim 32, wherein one of the third rail and the engaging member comprises a disengaging feature, the third rail is configured to disengage the elastic part of the engaging member from the opening of the first rail through the disengaging feature when the third rail is moved relative to the first rail along the second from an extended state.

36. The slide rail assembly of claim 35, wherein the first bracket and the first rail are movable relative to each other through a moving mechanism.

37. The slide rail assembly of claim 36, wherein the moving mechanism comprises at least one rolling member.

* * * * *